US012777941B2

(12) United States Patent
Cheng et al.

(10) Patent No.: US 12,777,941 B2
(45) Date of Patent: Oct. 27, 2026

(54) WIRE BOND ELECTROMAGNETIC INTERFERENCE (EMI) CAGE TO BLOCK TRANSMISSION AND RECEIPT OF EMI AT AN OPTICAL EMISSIONS COMPONENT

(71) Applicant: STMicroelectronics International N.V., Geneva (CH)

(72) Inventors: Kai Quan Cheng, Singapore (SG); Tat Ming Teo, Singapore (SG); Andrew John Price, Bonnyrigg (GB); William Halliday, Edinburgh (GB); Bhagya Prakash Bandusena, Singapore (SG); Calum Ritchie, Glasgow (GB)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 411 days.

(21) Appl. No.: 18/485,523

(22) Filed: Oct. 12, 2023

(65) Prior Publication Data

US 2025/0125279 A1 Apr. 17, 2025

(51) Int. Cl.
*H10W 42/20* (2026.01)
*H10W 72/50* (2026.01)

(52) U.S. Cl.
CPC .......... *H10W 42/20* (2026.01); *H10W 72/536* (2026.01); *H10W 72/5363* (2026.01)

(58) Field of Classification Search
CPC ............... H10W 42/20; H10W 72/536; H10W 72/5363; H05K 9/0058; H05K 9/0022
See application file for complete search history.

(56) References Cited

U.S. PATENT DOCUMENTS

| | | | | |
|---|---|---|---|---|
| 7,088,009 | B2 | 8/2006 | Hagen | |
| 9,240,372 | B1 | 1/2016 | Liou | |
| 10,477,673 | B2 | 11/2019 | Choi et al. | |
| 11,462,483 | B2 | 10/2022 | Awujoola et al. | |
| 2007/0207670 | A1 | 9/2007 | Stewart et al. | |
| 2009/0175582 | A1 * | 7/2009 | Togami ................ | G02B 6/4204 385/92 |

(Continued)

OTHER PUBLICATIONS

Extended European Search Report for Application No. 24200354.9, dated Mar. 21, 2025, 9 pages.

*Primary Examiner* — Dale E Page
*Assistant Examiner* — Quovaunda Jefferson
(74) *Attorney, Agent, or Firm* — Alston & Bird LLP

(57) ABSTRACT

An example apparatus and optical emission device for preventing the transmission of electromagnetic radiation to and from targeted electrical components of an electronic device are provided. The example apparatus may include an optical emissions component electrically connected to a target electrical portion and configured to generate an optical output. The example apparatus may further include a wire bond electromagnetic interference cage configured to block the passage of electromagnetic emissions. The wire bond electromagnetic interference cage may include a plurality of bond wires, wherein each bond wire is electrically coupled to an electrical ground, and wherein the wire bond electromagnetic interference cage overlays at least a portion of the target electrical portion. In addition, the wire bond electromagnetic interference cage may further define an electromagnetic interference cage opening through which the optical output passes.

19 Claims, 11 Drawing Sheets

(56) References Cited

U.S. PATENT DOCUMENTS

| | | | | |
|---|---|---|---|---|
| 2014/0270659 | A1* | 9/2014 | Schunk | G02B 6/4277 385/94 |
| 2016/0238805 | A1 | 8/2016 | McColloch | |
| 2017/0215305 | A1 | 7/2017 | Price et al. | |
| 2018/0098417 | A1* | 4/2018 | Gebauer | H05K 1/0216 |
| 2021/0050826 | A1 | 2/2021 | Ripley et al. | |

* cited by examiner

WIRE BOND ELECTROMAGNETIC INTERFERENCE (EMI) CAGE TO BLOCK TRANSMISSION AND RECEIPT OF EMI AT AN OPTICAL EMISSIONS COMPONENT

TECHNOLOGICAL FIELD

Embodiments of the present disclosure relate generally to an electromagnetic interference (EMI) shield, and more particularly, to an EMI shield comprising a cage of electrically grounded bond wires.

BACKGROUND

Various example embodiments address technical problems associated with preventing the transmission of electromagnetic radiation to and from electrical components of various electronic devices in an electronic system. Electronic systems may include numerous electronic devices that radiate electromagnetic waves and/or are affected by the radiation of electromagnetic waves. Exposure to EMI may cause an electrical device to generate errors while processing and/or transmitting data, or even cease operations.

Applicant has identified many technical challenges and difficulties associated with EMI shields in electronic systems. Through applied effort, ingenuity, and innovation, Applicant has solved problems related to EMI shields in electronic systems by developing solutions embodied in the present disclosure, which are described in detail below.

BRIEF SUMMARY

Various embodiments are directed to an example apparatus and optical emission device for preventing the transmission of electromagnetic radiation to and from electrical components of an electronic device. In some embodiments, the example apparatus may comprise an optical emissions component electrically connected to a target electrical portion and configured to generate an optical output. The example apparatus may further comprise a wire bond electromagnetic interference cage configured to block the passage of electromagnetic emissions. The wire bond electromagnetic interference cage comprising a plurality of bond wires, wherein each bond wire of the plurality of bond wires is electrically coupled to an electrical ground, and wherein the wire bond electromagnetic interference cage overlays at least a portion of the target electrical portion. In addition, the wire bond electromagnetic interference cage may further define an electromagnetic interference cage opening through which the optical output passes.

In some embodiments, the optical emissions component further comprises a first side and a second side opposite the first side, wherein each bond wire of the plurality of bond wires is electrically connected to the electrical ground at a first bond wire end on the first side of the optical emissions component, wherein each bond wire of the plurality of bond wires is electrically connected to the electrical ground at a second bond wire end on the second side of the optical emissions component such that each bond wire passes over a portion of the optical emissions component, and wherein each bond wire extends to a maximum wire bond electromagnetic interference cage height.

In some embodiments, the apparatus further comprises a second plurality of bond wires, wherein the optical emissions component includes a first end and a second end, wherein each bond wire of the second plurality of bond wires is electrically connected to the electrical ground on the first end of the optical emissions component, and wherein each bond wire of the second plurality of bond wires is electrically connected to the electrical ground on the second end of the optical emissions component such that each bond wire of the second plurality of bond wires passes over a portion of the optical emissions component perpendicular to the plurality of bond wires.

In some embodiments, the plurality of bond wires are parallel.

In some embodiments, the maximum wire bond electromagnetic interference cage height is a distance from the top of the optical emissions component to a bond wire of the plurality of bond wires.

In some embodiments, the maximum wire bond electromagnetic interference cage height is between 0.050 millimeters and 0.160 millimeters.

In some embodiments, the plurality of bond wires comprise at least a first bond wire and a second bond wire, and wherein the first bond wire and the second bond wire cross.

In some embodiments, the wire bond electromagnetic interference cage comprises a first gap corresponding to a distance between each bond wire of the plurality of bond wires, wherein the wire bond electromagnetic interference cage further comprises a second gap defining the electromagnetic interference cage opening, and wherein the first gap is smaller than the second gap.

In some embodiments, the first gap is less than or equal to 0.6 millimeters.

In some embodiments, the first bond wire end of each bond wire of the plurality of bond wires is attached to the electrical ground with a ball bond and the second bond wire end of each bond wire of the plurality of bond wires is attached to the electrical ground with a ball bond or a wedge bond.

In some embodiments, the optical emissions component comprises a vertical-cavity surface-emitting laser.

In some embodiments, the target electrical portion is susceptible to electromagnetic interference.

In some embodiments, the wire bond electromagnetic interference cage blocks the transmission of electromagnetic interference to the target electrical portion from an external electromagnetic interference source.

In some embodiments, the target electrical portion generates electromagnetic interference.

In some embodiments, the wire bond electromagnetic interference cage blocks the transmission of electromagnetic interference from the target electrical portion.

In some embodiments, the wire bond electromagnetic interference cage is configured to block electromagnetic emissions up to 10 gigahertz.

An example optical emission device is further provided. In some embodiments, the example optical emission device comprises a device housing. In addition, the example optical emission device may further comprise one or more electrical components disposed on a substrate within the device housing. In some embodiments, the one or more electrical components comprising at least an optical emissions component electrically connected to a target electrical portion and configured to generate an optical output. In some embodiments, the one or more electrical components may further comprise a wire bond electromagnetic interference cage disposed within the device housing and configured to block the passage of electromagnetic emissions. In some embodiments, the wire bond electromagnetic interference cage comprising a plurality of bond wires, wherein each bond wire of the plurality of bond wires is electrically coupled to an electrical ground, wherein the wire bond electromagnetic interference cage overlays at least a portion of the target electrical portion, and wherein the wire bond electromagnetic interference cage defines an electromagnetic interference cage opening through which the optical output passes.

In some embodiments, the device housing further comprises an optical emission opening aligned with the optical emissions component and configured to allow the optical output to pass out of the device housing.

In some embodiments, the optical emission opening is bigger than the electromagnetic interference cage opening.

In some embodiments, the optical emissions component further comprises a first side and a second side opposite the first side, wherein each bond wire of the plurality of bond wires is electrically connected to the electrical ground at a first bond wire end on the first side of the optical emissions component, wherein each bond wire of the plurality of bond wires is electrically connected to the electrical ground at a second bond wire end on the second side of the optical emissions component such that each bond wire passes over a portion of the optical emissions component, and wherein each bond wire extends to a maximum wire bond electromagnetic interference cage height.

BRIEF DESCRIPTION OF THE DRAWINGS

Reference will now be made to the accompanying drawings. The components illustrated in the figures may or may not be present in certain embodiments described herein. Some embodiments may include fewer (or more) components than those shown in the figures in accordance with an example embodiment of the present disclosure.

DETAILED DESCRIPTION

Example embodiments will be described more fully hereinafter with reference to the accompanying drawings, in which some, but not all embodiments of the inventions of the disclosure are shown. Indeed, embodiments of the disclosure may be embodied in many different forms and should not be construed as limited to the embodiments set forth herein; rather, these embodiments are provided so that this disclosure will satisfy applicable legal requirements. Like numbers refer to like elements throughout.

Various example embodiments address technical problems associated with preventing the transmission and/or receipt of disruptive electromagnetic radiation emanating to and from electrical components contained within the various electronic devices of an electronic system. As understood by those of skill in the field to which the present disclosure pertains, there are numerous example scenarios in which it may be necessary to block the transmission of electromagnetic radiation from an electrical component and/or prevent the receipt of electromagnetic radiation an electrical component.

For example, electronic systems may include numerous electrical components that radiate electromagnetic radiation and/or are affected by the radiation of electromagnetic waves. As electronic systems shrink in size and the electrical devices are moved closer together, errors due to EMI may be exacerbated. The issue EMI is further aggravated by the desire for higher power electrical devices in the electronic system. The adverse effects on electrical components in high power electronic devices are increased as the power increases. In addition, higher communication frequencies (e.g., 4G to 5G mobile phones transmitting at frequencies between 900 megahertz to 5 gigahertz) may result in communication devices that are more susceptible to error due to EMI. The combination of higher power electrical components in closer proximity and high frequency communications can result in unwanted cross-talk, coupling, and/or comingling resulting in performance loss on electronic devices.

In some examples, metal can EMI shields are created by stamping stainless steel sheets to create a conductive envelope around the housing of an electronic device comprising one or more electrical components. These metal can EMI shields are generally positioned outside of the electrical component package and attached to the host circuit board to which the electrical component package is attached.

Figure 1A:
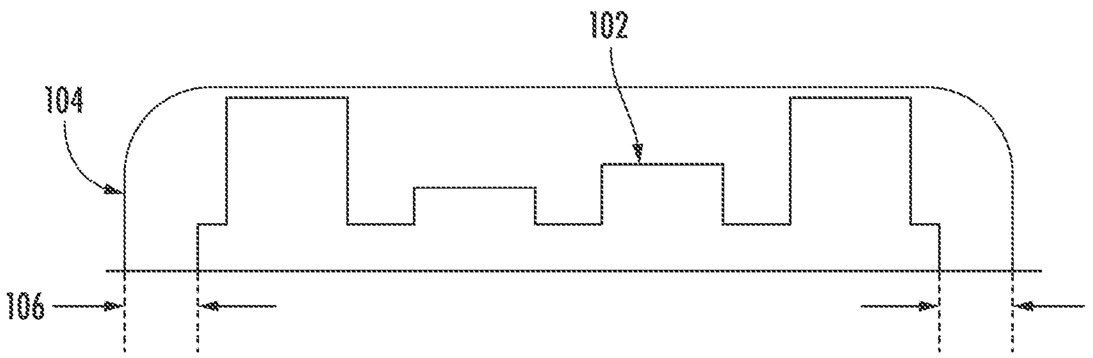
FIG. 1A (PRIOR ART)
FIG. 1A-FIG. 1B illustrate example prior art metal can EMI shields exterior to the device housing of an electronic device.

As shown in FIG. 1A, due to the manufacturing process, the example metal can EMI shield 104 is unable to conform closely to the shape of the underlying electronic device. For example the stamping or deep drawing process prevents the manufacturing of metal can EMI shields 104 with sharp corners. The limitations on shaping a metal can EMI shield 104 result in the metal can EMI shield 104 occupying additional space 106 around the electronic device 102. The introduction of the metal can EMI shield 104 would hence increase the overall outline of the existing electronic component 102 through the requirements for additional space 106 and may prevent device manufacturers from further reducing the space occupied by existing electronic devices 102 in an electronic system (e.g., mobile phone, tablet, laptop, etc.). Thus, the metal can EMI shields 104 comprising stamped stainless steel sheets utilize more space on the host circuit board of the electronic system.

Figure 1B:
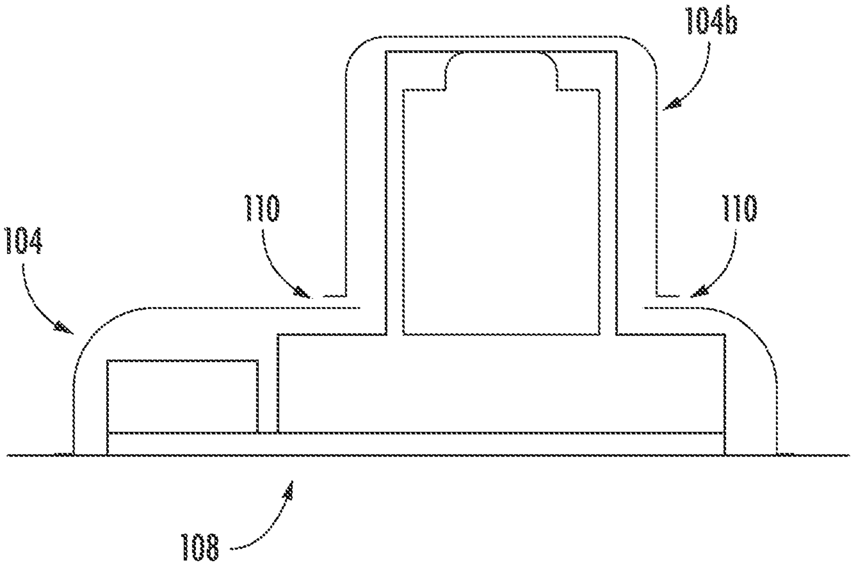
FIG. 1B (PRIOR ART)

In addition, as depicted in FIG. 1B, the lack of flexibility in manufacturing a metal can EMI shield 104 results in an inability to conform the metal can EMI shield 104 with the topography and/or shape of the underlying electronic devices 108 with more complex outlines. To provide protection from electromagnetic radiation in such situations, manufacturers may piece together multiple metal can EMI shields 104, 104*b*. Piecing together multiple metal can EMI shields 104, 104*b* may result in gaps 110 in the protective shield provided by the metal can EMI shields 104, 104*b*. Gaps 110 may enable the escape and/or admission of disruptive electromagnetic radiation, especially with higher frequency EM waves which are more capable of penetrating smaller shield openings (e.g., gaps 110).

Further issues result in attempting to insulate or protect optical emission devices, such as optical range sensors, from transmitting and/or receiving electromagnetic radiation. Optical range sensors generally require an optical emission region (e.g., aperture or opening) through which an optical output may be emitted. Thus, any EMI shield must also provide an opening through which the optical output may pass unhindered. EMI shields external to the electrical device housing are further removed from the optical emission region of the optical emission device. An EMI shield (e.g., metal can EMI shield 104) farther removed from the optical emission region of the optical emission device must be larger to allow the full optical field of the optical output to pass through. The larger opening in the EMI shield allows transmission and receipt of electromagnetic waves, disrupting the operation of susceptible electrical components.

The various example embodiments described herein utilize various techniques to create a wire bond EMI cage for an optical emission device, utilizing bond wires to create a Faraday cage, preventing the transmission of electromagnetic radiation through the grounded wire bond EMI cage, while simultaneously enabling the emission of an optical output.

For example, in some embodiments, the wire bond EMI cage may be formed using established wire bonding techniques. In such an embodiment, a bond wire may be connected to one or more ground pads providing electrical grounding in the substrate of an electronic device. The bond wire is then passed over the target electrical portion or portions of the electrical component and bonded to the substrate on the opposite side of the electronic device. The process is repeated until a plurality of bond wires form a cage around the target electrical portion or portions of the electrical component. Such a wire bond EMI cage enables substrate and packaging design engineers to protect EM emissions sources or EM susceptible target electrical portions within the device housing of an electronic device.

In some embodiments, the wire bond EMI cage may be configured to protect an optical emission device generating an optical output. The wire bond EMI cage may further provide an EMI cage opening aligned with the optical emission region of the optical emissions component. The EMI cage opening allows the light output from the optical emission device to pass through while preventing the transmission and receipt of electromagnetic radiation to and from the target electrical component. The use of bond wires to create a wire bond EMI cage with an EMI cage opening allows the passage of optical output through the wire bond EMI cage without the wire bond EMI cage interfering with the optical field. Because of the close proximity of the wire bond EMI cage to the optical emissions component, the EMI cage opening may be smaller than previous metal can EMI shields (e.g., metal can EMI shield 104) utilizing a stamped metal shield. Stamped metal can EMI shields are placed on the outside of the electronic device housing, further away from the optical emissions component, thus requiring a larger opening for the optical field of the optical output to pass through.

In addition, because of the flexibility in forming various wire bond EMI cage shapes, the wire bond EMI cage may conform to the topography of the underlying optical emissions component. For example, the wire bond EMI cage may be designed to conform to the contours of the target electrical portion of the underlying optical emissions component to further prevent the transmission and/or receipt of electromagnetic radiation. The flexibility in forming various wire bond EMI cages may also enable the size and shape of the EMI cage opening to be adjusted based on the underlying optical emissions component, and the desired optical output.

As further described herein, in some embodiments, the wire bond EMI cage may be utilized to prevent the transmission and receipt of electromagnetic radiation to and from other electrical components within an electronic system. For example, any electrical component identified as a source of electromagnetic radiation transmission may be enclosed by a wire bond EMI cage to prevent the electromagnetic radiation from interfering with other components on the electronic system. Similarly, any electrical component identified as being susceptible to disruption from external electromagnetic transmissions may be shielded by a wire bond EMI cage enclosing the electrical component. Such electrical components may include any surface mount technology (SMT) electrical component, substrate trace, or other electrical component.

As a result of the herein described example embodiments and in some examples, the effectiveness of an EMI protective shield around an optical emissions component may be greatly improved. In addition, the space required to implement a protective EMI shield may be greatly reduced.

Figure 2A:
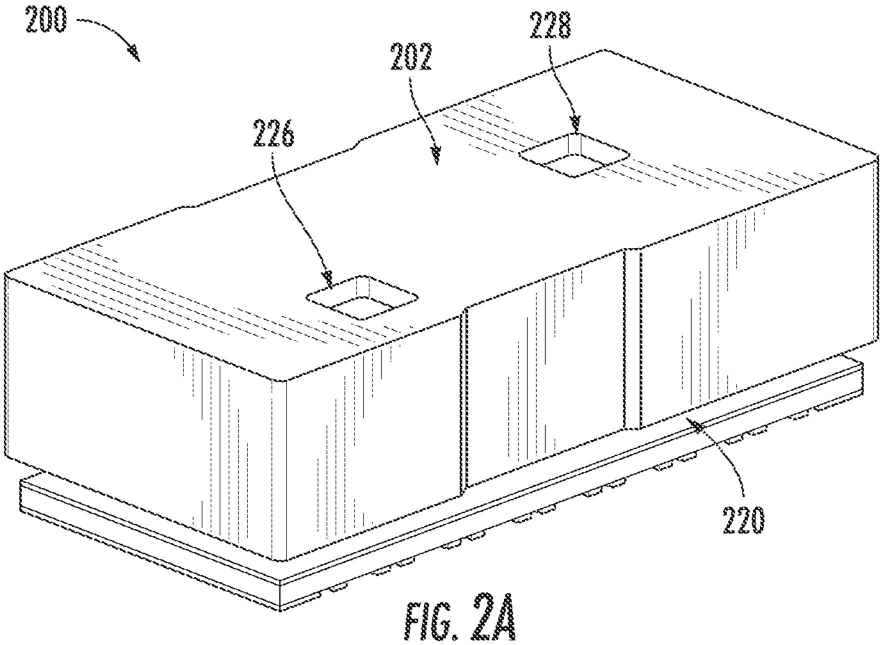
FIG. 2A-FIG. 2B illustrates a perspective view an example optical emission device comprising a device housing in accordance with an example embodiment of the present disclosure.
Figure 2B:
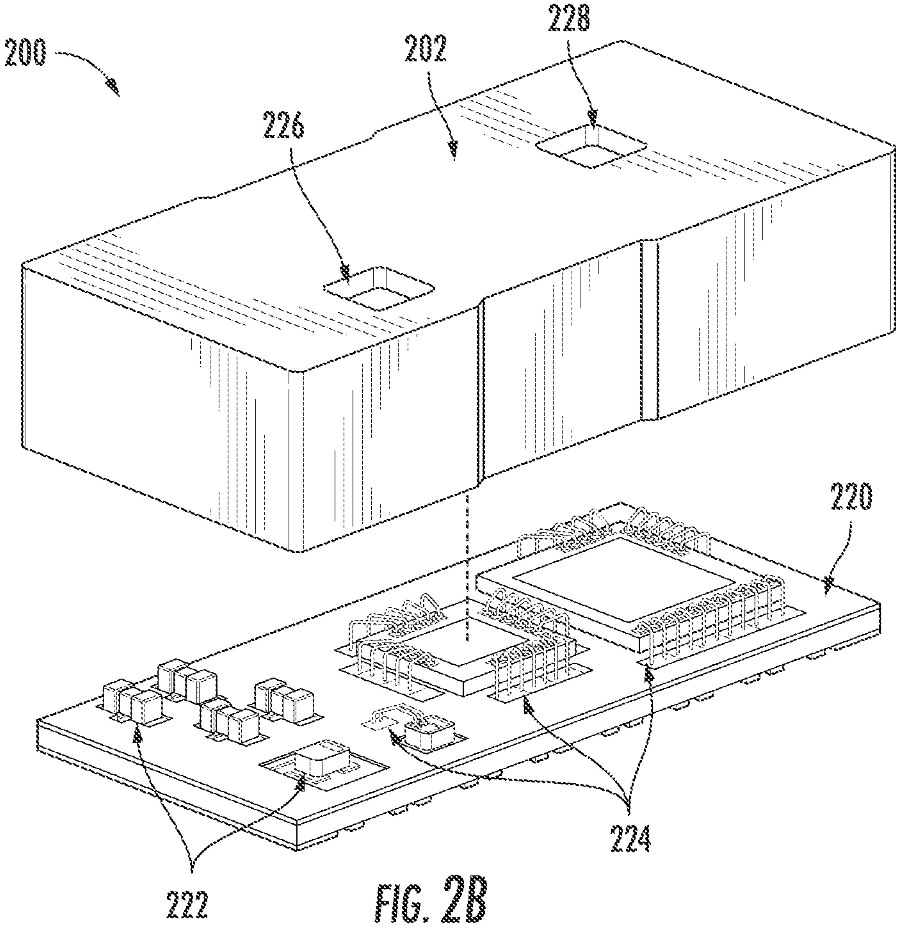

Referring now to FIG. 2A-FIG. 2B, an example optical emission device is shown. As depicted in FIG. 2B, the example optical emission device 200 comprises a substrate 220 electrically interconnecting a plurality of electrical components 222. As further depicted in FIG. 2B, the electrical components 222 are electrically connected to the substrate 220 with wire bonds 224. The example optical emission device 200 further includes a device housing 202.

As depicted in FIG. 2A, the example optical emission device 200 the device housing 202 is configured to attach to the substrate 220 to protect the internal electrical components 222 of the optical emission device 200. As further depicted in FIG. 2A, the device housing 202 includes an optical emission opening 226, aligned with the optical emission region of the optical emissions component to allow the transmission of an optical output. The device housing 202 further includes a receiver opening 228 configured to receive optical input to an internal photosensitive sensor.

As depicted in FIG. 2A-FIG. 2B, an optical emission device 200 is any device and accompanying circuitry configured to generate an optical output (e.g., laser, light, etc.). An optical emission device 200 comprises one or more optical emissions components (e.g., optical emissions component 440, 540, 640, 740, 840 as described in relation to FIG. 4-FIG. 8) including an optical emission region configured to direct the optical output. In some embodiments, an optical emission device 200 may comprise a vertical-cavity surface-emitting laser (VCSEL) configured to output a laser optical output.

An optical emission device 200 further includes a plurality of electrical components 222. An electrical component 222 is any discrete physical entity which receives an electrical input and imposes a function affecting the received electrical input. Electrical components 222 may include but are not limited to wires, switches, capacitors, resistors, inductors, diodes, transistors, bridges, or any combination thereof. In some embodiments, electrical components 222 may comprise surface-mount technology (SMT) stand-alone components. SMT electrical components 222 are mounted directly to electrically conductive pads on the surface of the substrate 220.

In some embodiments, electrical components 222 may be electrically connected to the substrate 220 using wire bonds 224. Wire bonding is a method for creating electrical connections between the conductive portions (e.g., pads) on a substrate 220 (e.g., printed circuit board) and the electrical input and/or output of an electrical component 222. Wire bonds may comprise aluminum, copper, silver, gold, or other similar conductive materials. In some embodiments, a wire bond 224 may be creating using a ball bonding technique (e.g., ball bond), in which a ball at the end of the wire bond 224 is welded to the surface of the substrate 220 using a combination of pressure, heat, and ultrasonic energy. In some embodiments, a wire bond 224 may be created using a wedge bonding technique (e.g., wedge bond), in which a wire bond 224 is created in a directional manner by pressure against a pad on the substrate 220.

In some embodiments, an optical emission device 200, may connect electrical components 222 by substrate traces within the substrate 220. Substrate traces are electrically conductive conduits created within the substrate 220 material to provide an electrical connection between electrical components 222 of the optical emission device 200. In some embodiments, the substrate traces may be routed under the solder mask of the substrate 220.

In some embodiments, optical emission device 200 may further comprise a photosensitive receiving electrical component configured to receive the reflected optical output. For example, an optical emission device may comprise a proximity sensor or similar device configured to emit an optical output at a target, receive the optical output reflected off the target, and determine one or more distances based on the received optical output.

As further depicted in FIG. 2A-FIG. 2B, the optical emission device 200 includes a device housing 202. A device housing 202 may be any package, cover, container, or other covering configured to protect the internal electrical components 222 of the optical emission device 200. In some embodiments, the device housing 202 may further include conductive pins and/or conductive pads to provide an electrical connection to the internal electrical components 222. A device housing 202 may comprise plastic, ceramic, or other protective non-conductive material.

As further depicted in FIG. 2A-FIG. 2B, the device housing 202 includes an optical emission opening 226 and a receiver opening 228. Openings in a device housing 202 may enable the flow of optical signals into and out of the optical emission device 200. For example, the optical emission opening 226 may be aligned with the optical emission region of an optical emissions component. The optical output from the optical emissions component may pass through the optical emission opening 226 toward the intended target. Similarly, a receiver opening 228 may enable the receipt of optical signals into the optical emission device 200, for example, to be received by a photosensitive receiver and analyzed by a processor or other device.

Figure 3:
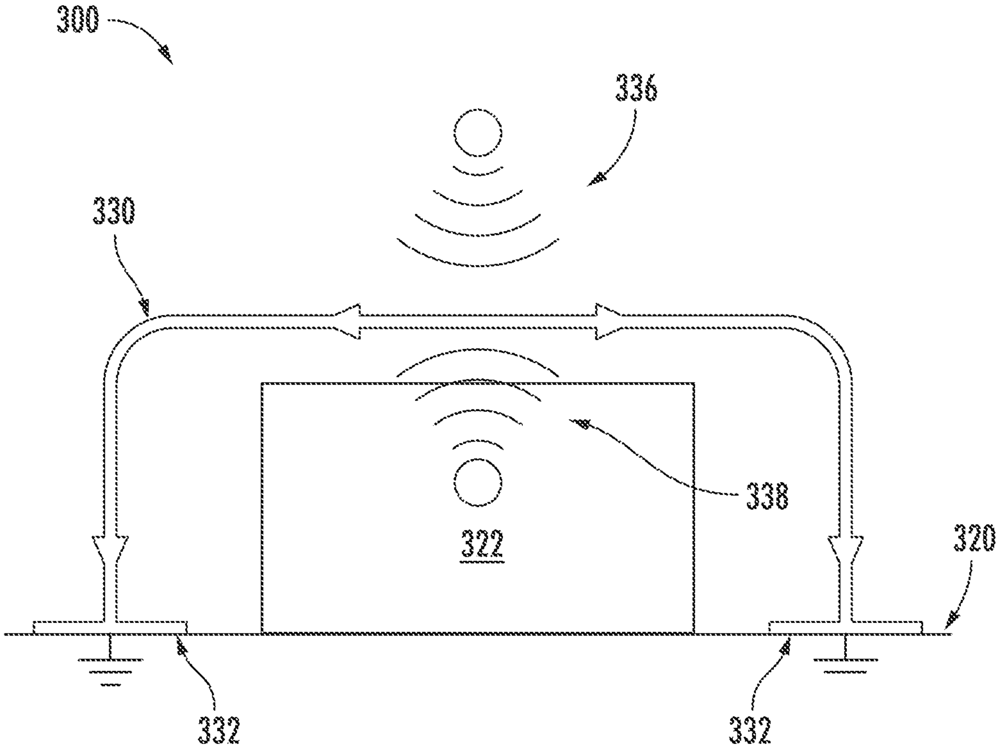
FIG. 3 illustrates a perspective view an example wire bond EMI cage in accordance with an example embodiment of the present disclosure.

Referring now to FIG. 3, an example wire bond EMI cage 300 is provided. As depicted in FIG. 3, the example wire bond EMI cage 300 includes one or more grounded bond wires 330. The grounded bond wires 330 at least partially encompassing an electrical component 322 and attached using wire bonding techniques. Bond wires may comprise aluminum, copper, silver, gold, or other similar conductive materials. In some embodiments, a grounded bond wire 330 may be attached using a ball bonding technique, in which a ball at the end of the grounded bond wire 330 is welded to the surface of the substrate 320 or ground plate 332 using a combination of pressure, heat, and ultrasonic energy. In some embodiments, a grounded bond wire 330 may be created using a wedge bonding technique, in which a wire bond 224 is created in a directional manner by pressure against a pad on the substrate 320 or ground plate 332.

In some embodiments, the grounded bond wires 330 are attached to the substrate 320 at a ground plate 332 (e.g., electrical ground) on a first side of an electrical component 322 and pass over the electrical component 322 to attach to a ground plate 332 on a second side of the electrical component 322. The one or more grounded bond wires 330 form a Faraday cage around the electrical component 322, preventing internal electromagnetic emissions 338 from transmitting outside of the wire bond EMI cage 300 and preventing external electromagnetic emissions 336 from entering into the wire bond EMI cage 300.

As depicted in FIG. 3, the example wire bond EMI cage 300 is configured to envelope one or more electrical components 322. In some embodiments, an electrical component 322 may be susceptible to disruption from external electromagnetic emissions 336. For example, an electrical component 322 may be configured to transmit and receive data. External electromagnetic emissions 336 may corrupt data during processing or transmission, or may even cause the electrical component 322 to cease operation. One example electrical component 322 susceptible to disruption by external electromagnetic emissions 336 is a communication antenna. In addition, as communication frequency rates and data rates increase, the communication antenna becomes more susceptible to error due to external electromagnetic emissions 336.

A wire bond EMI cage 300 may be configured to envelope an electrical component 322 susceptible to disruption from external electromagnetic emissions 336 to protect the electrical component 322 from the external electromagnetic emissions 336. External electromagnetic emissions 336 may be any electromagnetic radiation and/or waves of electromagnetic field propagating through space. In some embodiments, external electromagnetic emissions 336 may emanate from various electrical components within the same electronic device (e.g., optical emission device 200) or electronic system. In some embodiments, external electromagnetic emissions 336 may emanate from sources external to the electronic system.

In some embodiments, an electrical component 322 may be identified as an electromagnetic radiation emitting component. Such an electrical component 322 may emit internal electromagnetic emissions 338. Internal electromagnetic emissions 338 may disrupt the operation of other electrical components.

As such, a wire bond EMI cage 300 may be configured to envelope an electrical component 322 identified as generating internal electromagnetic emissions 338. In such an instance, the wire bond EMI cage 300 may prevent the internal electromagnetic emissions 338 from exiting the wire bond EMI cage 300.

As depicted in FIG. 3, the grounded bond wires 330 comprising the wire bond EMI cage 300 forms a Faraday cage. A Faraday cage is a continuous covering comprising conductive materials configured to prevent the transmission of electromagnetic radiation through the cage. A Faraday cage effectively cancels the effect of an incoming or outgoing electric field by distributing the electric charges of the electric field within the conductive material comprising the cage (e.g., grounded bond wires 330). The conductive materials comprising the Faraday cage are grounded to dissipate any electric currents generated from the electric field, thus blocking the transmission of electromagnetic radiation through the Faraday cage.

Figure 4:
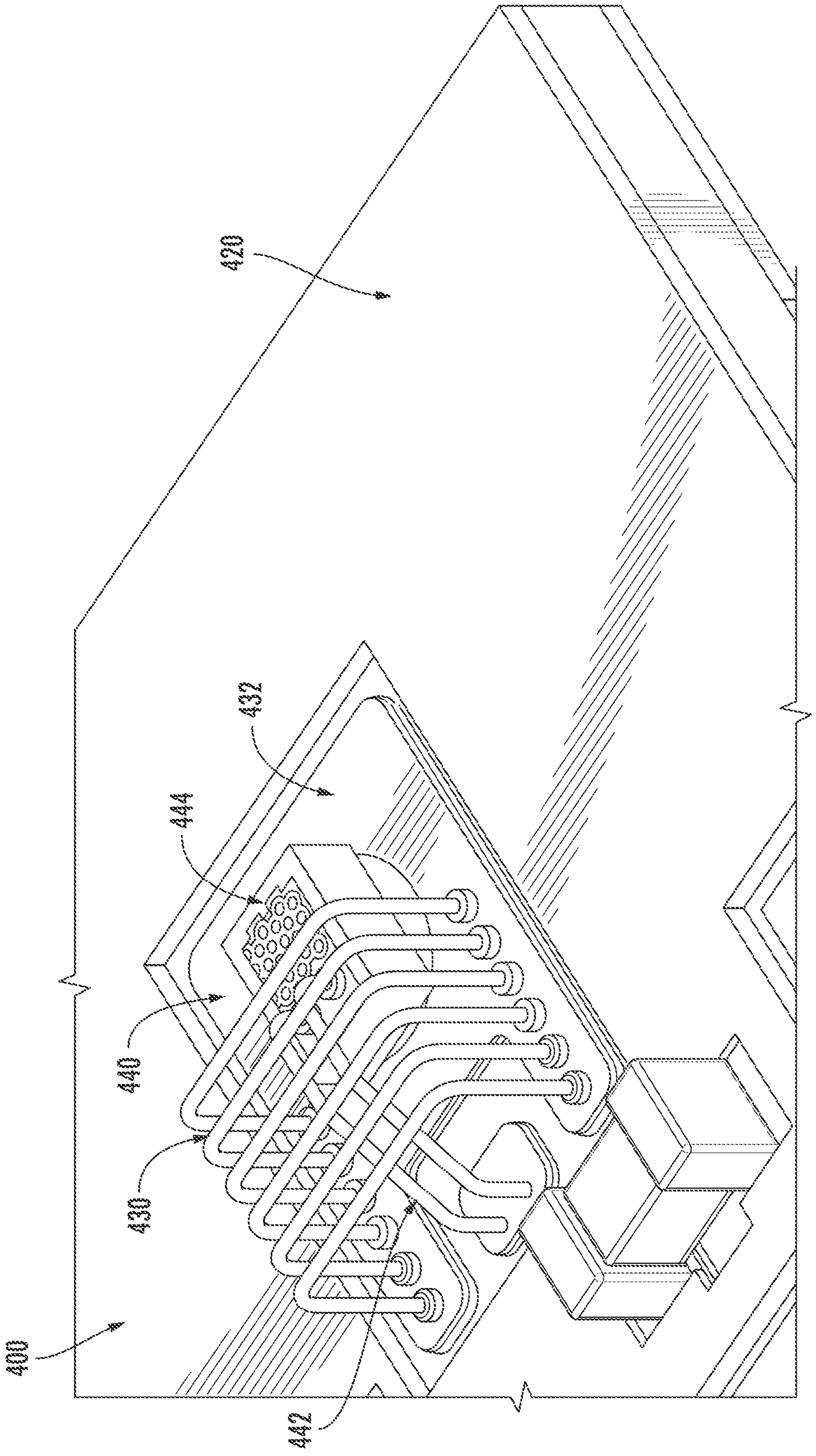
FIG. 4 illustrates a perspective view an example wire bond EMI cage overlaying a target electrical portion of an optical emissions component in accordance with an example embodiment of the present disclosure.

Referring now to FIG. 4, an example optical emissions component 440 protected by an example wire bond EMI cage 400 is provided. As depicted in FIG. 4, the example wire bond EMI cage 400 comprises a plurality of grounded bond wires 430 mounted at each end to a ground plate 432 and overlaying a target electrical portion 442. The example optical emissions component 440 further includes an optical emission region 444 uncovered by the wire bond EMI cage 400. As further depicted in FIG. 4, the optical emissions component 440 is attached to a substrate 420.

As depicted in FIG. 4, the example optical emissions component 440 includes the optical emission region 444 and a target electrical portion 442. The optical emission region 444 is any hole, gap, slit, aperture, or other opening configured to direct the optical output from the optical emissions component 440. In some embodiments, the optical emission region 444 may be accompanied by lens or other optical device configured to aid in directing the optical output of the optical emissions component 440. The space above the optical emission region 444 is uncovered by any wire bond EMI cage 400, cover, shield, or device housing allowing optical output to exit the optical emission device uninhibited.

As further depicted in FIG. 4, the example optical emissions component 440 includes a target electrical portion 442. The target electrical portion 442 is any portion of any electrical component (e.g., optical emissions component 440) that is identified as emitting disruptive electromagnetic radiation and/or susceptible to disruption from external electromagnetic radiation. In some embodiments, a target electrical portion 442 may be identified as an emitter of disruptive electromagnetic radiation and/or susceptible to electromagnetic radiation through simulation and/or testing. A non-limiting example of a target electrical portion 442 identified as a source of disruptive electromagnetic radiation are the power transmission bond wires as shown in FIG. 4. These wires provide necessary power to the optical output generating circuitry of an optical emissions component. As the data rate and power of the optical output generating circuitry increase, the amount of disruptive electromagnetic radiation emanating from the wires providing the necessary power may also increase. Other example sources of disruptive electromagnetic radiation may include any high powered or high data rate SMT electrical components, wires transmitting power and/or data, substrate traces, and other similar electrical components. Non-limiting examples of electrical components susceptible to disruption from external electromagnetic radiation may include transceiver antenna electrical components, SMT electrical components, data transmission substrate traces, and other similar electrical components.

As further depicted in FIG. 4, the example wire bond EMI cage 400 includes a plurality of grounded bond wires 430. As described in relation to FIG. 3, the grounded bond wires 430 are any wire comprising aluminum, copper, silver, gold, or other similar conductive materials and attached to the surface of the substrate 420 or ground plate 432 using wire bonding techniques. The grounded bond wires 430 are configured to at least partially encompass the target electrical portion 442. In addition, the grounded bond wires 430 are position so as not to interfere with the optical output of the optical emissions component 440.

The one or more grounded bond wires 430 form a Faraday cage around the target electrical portion 442, preventing electromagnetic radiation from transmitting through the wire bond EMI cage 400 either into or out of the wire bond EMI cage 400.

Figure 5:
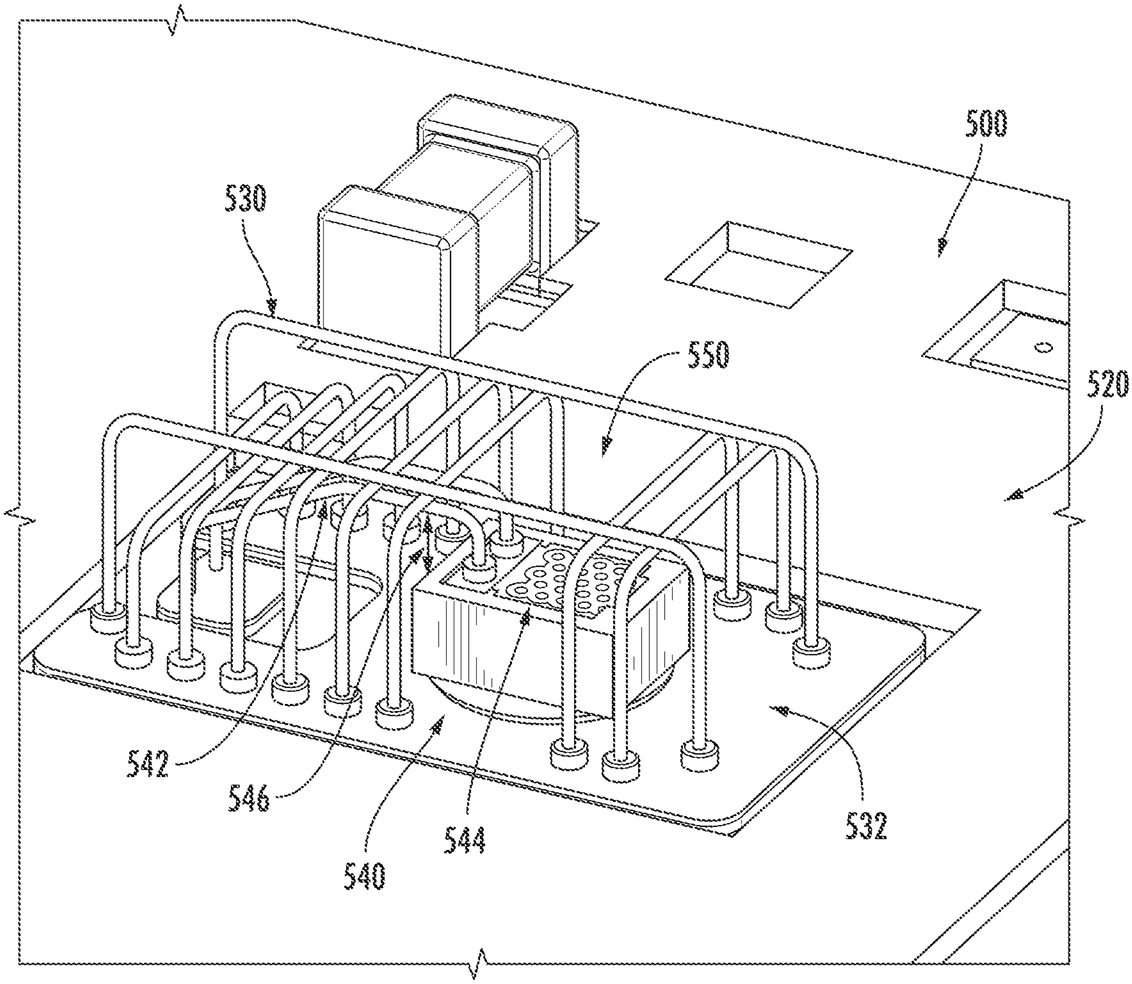
FIG. 5 illustrates a perspective view of an example wire bond EMI cage encasing an example optical emissions component in accordance with an example embodiment of the present disclosure.

Referring now to FIG. 5, an example wire bond EMI cage 500 is provided. As depicted in FIG. 5, the example wire bond EMI cage 500 comprises a plurality of grounded bond wires 530 attached to the ground plate 532 and extending over portions of an optical emissions component 540. The wire bond EMI cage 500 further defines and EMI cage opening 550 immediately adjacent to the optical emission region 544 of the optical emissions component 540 and aligned with the optical emission region 544 such that an optical output traverses through the EMI cage opening 550. The optical emissions component further includes a target electrical portion 542. As further depicted in FIG. 5, the optical emissions component 540 is attached to a substrate 520.

As depicted in FIG. 5, the example wire bond EMI cage 500 defines an EMI cage opening 550. An EMI cage opening 550 is any hole, gap, or window positioned adjacent to the optical emission region 544 of the optical emissions component 540 and aligned such that the optical output of the optical emissions component 540 may exit the wire bond EMI cage 500 uninhibited. The EMI cage opening 550 is described further in relation to FIG. 6-FIG. 8.

As further depicted in FIG. 5, the wire bond EMI cage 500 is positioned at a wire bond EMI cage height 546 measured from the top surface of the optical emission region 544 of the optical emissions component 540 to the bottom surface of the nearest grounded bond wires 530. As the wire bond EMI cage height 546 is decreased, the size of the EMI cage opening 550 may also be decreased. As the EMI cage opening 550 is decreased fewer electromagnetic radiation emissions are permitted to traverse through the wire bond EMI cage 500 to and from the target electrical portion 542. In some embodiments, the wire bond EMI cage height 546 may be subject to a maximum wire bond electromagnetic interference cage height, to limit the size of the EMI cage opening 550 and prevent the passage of electromagnetic radiation into and out of the wire bond EMI cage 500. In some embodiments, the wire bond electromagnetic interference cage height is routed between 0.050 millimeters and 0.160 millimeters above the component being shielded.

Figure 6:
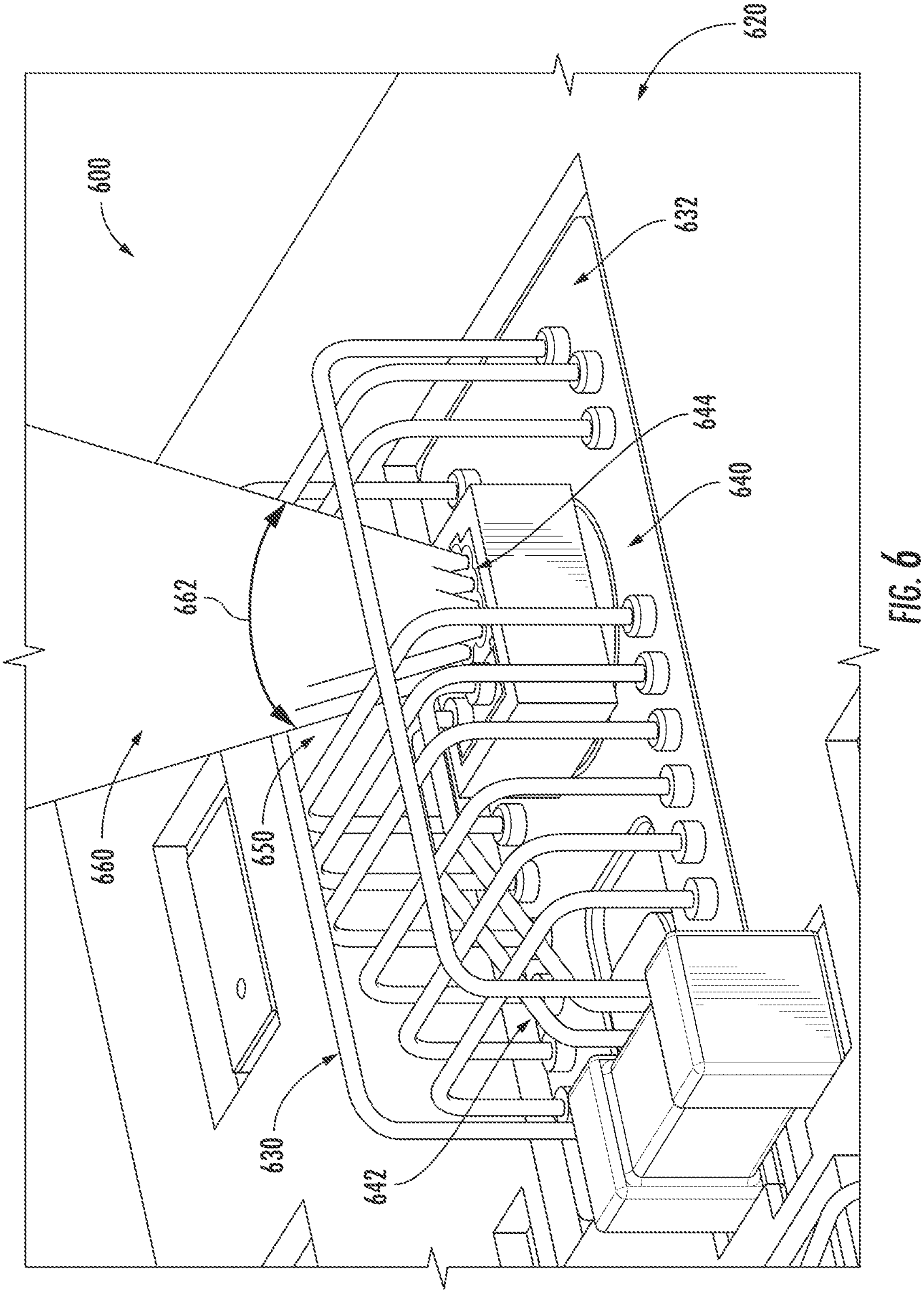
FIG. 6 illustrates a perspective view of an example wire bond EMI cage defining an EMI cage opening allowing the transmission of optical output in accordance with an example embodiment of the present disclosure.

Referring now to FIG. 6, an example wire bond EMI cage 600 is provided. As depicted in FIG. 6, the example wire bond EMI cage 600 includes a plurality of grounded bond wires 630 configured to prevent electromagnetic radiation from transmitting to or from a target electrical portion 642 of an optical emissions component 640. In addition, the wire bond EMI cage 600 defines an EMI cage opening 650 positioned to enable optical output 660 to pass through the wire bond EMI cage 600 unimpeded. As further depicted in FIG. 6, each of the grounded bond wires 630 of the wire bond EMI cage 600 are attached to a ground plate 632. As further depicted in FIG. 6, the optical emissions component 640 is attached to a substrate 620.

As depicted in FIG. 6, the wire bond EMI cage 600 includes an EMI cage opening 650 enabling the passage of optical output 660 out of the wire bond EMI cage 600. Optical output 660 may be any illumination output, for example, visible light, ultraviolet light, infrared light, a laser beam, or other optical illumination. The optical output 660 may be directed by the geometries of the optical emission region 644, a lens, or other optical device configured to direct the optical output 660 toward a target. In addition, various physical characteristics of the optical output 660 may be adjusted, for example, the frequency/wavelength and the power or amplitude may be adjusted based on the intended use of the optical output 660.

In addition, the optical output 660 may comprise an optical field of illumination 662. The optical field of illumination 662 is the area illuminated by the optical output 660 defined based on the angle of divergence of the optical output 660 from the optical emission region 644. For example, in some embodiments, the optical field of illumination 662 may be 31-degrees, meaning the optical output 660 diverges from the optical emission region 644 at an angle of 31-degrees in one or more directions. Thus, as the optical output 660 transmits farther from the optical emission region 644, the cross-sectional area of the optical output 660 increases, meaning the farther away an EMI cage opening 650 is away from the optical emission region 644, the bigger the EMI cage opening 650 must be to allow the full optical field of illumination 662 of the optical output 660 to pass through uninhibited. In some embodiments, the optical field of illumination 662 may comprise a non-circular shape. In such an embodiment, the angle of divergence varies in different directions.

Figure 7:
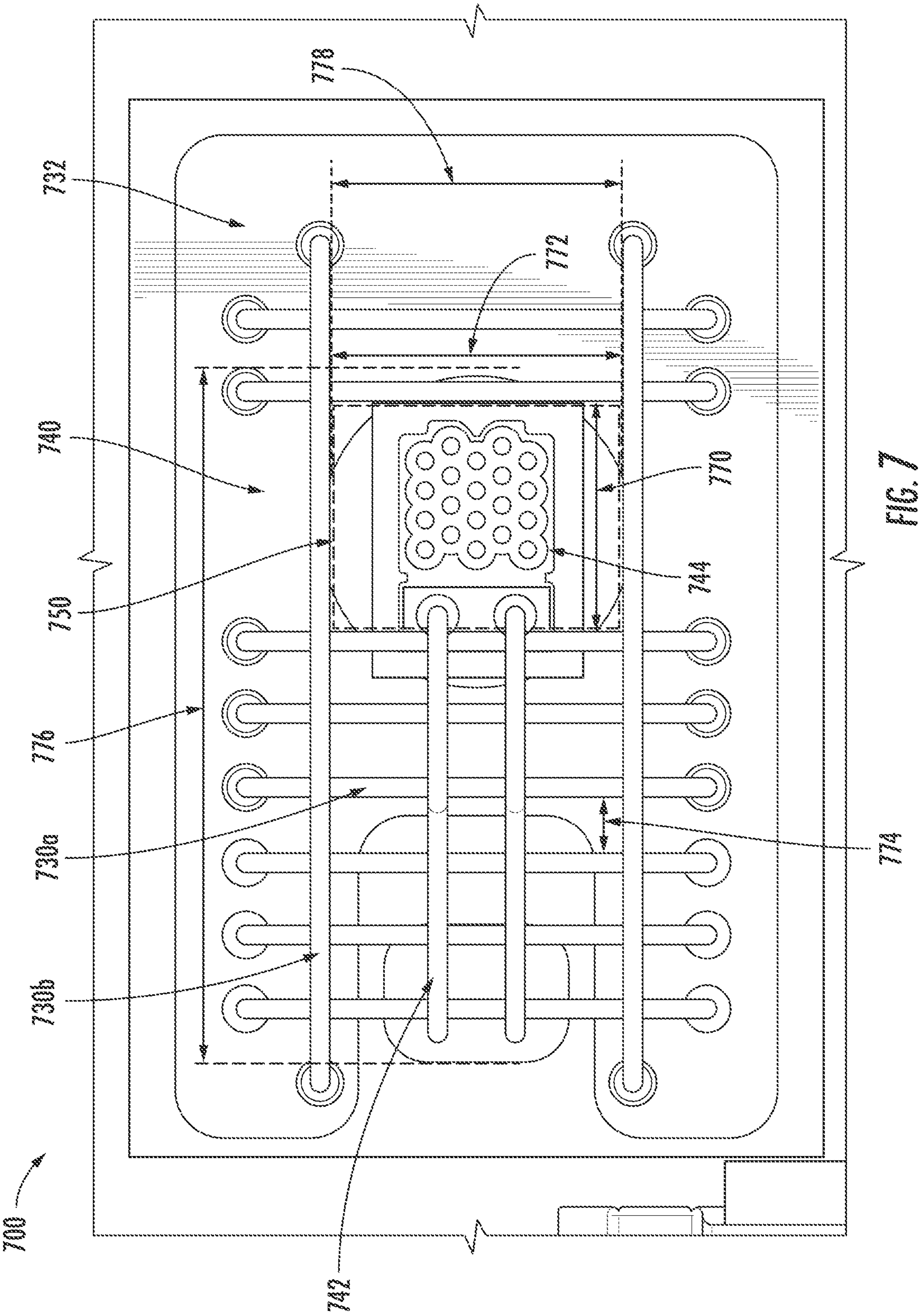
FIG. 7 illustrates an overhead view of an example EMI cage opening in an example wire bond EMI cage in accordance with an example embodiment of the present disclosure.

Referring now to FIG. 7, a top view of an example wire bond EMI cage 700 is depicted. As shown in FIG. 7, the example wire bond EMI cage 700 includes a plurality of grounded bond wires 730*a*, 730*b* enclosing various portions of the underlying optical emissions component 740, including the target electrical portion 742 of the optical emissions component 740. As further depicted in FIG. 7, the wire bond EMI cage 700 defines an EMI cage opening 750 aligned with the optical emission region 744 of the optical emissions component 740. The EMI cage opening 750 is defined by an EMI cage opening gap height 770 between the second set of grounded bond wires 730*b* and an EMI cage opening gap width 772 between the first set of grounded bond wires 730*a*, each dimension of the EMI cage opening 750 larger than the EMI cage gap 774 of the wire bond EMI cage 700.

As depicted in FIG. 7, the optical emissions component 740 has a first dimension (e.g., length 776) and a second dimension (e.g., width 778). The wire bond EMI cage 700 includes a first set of grounded bond wires 730*a* (e.g., plurality of bond wires), configured to attach to the ground plate 732 and overlay the optical emissions component 740 parallel to the width 778 of the optical emissions component 740. In addition, the wire bond EMI cage 700 includes a second set of grounded bond wires 730*b* (e.g., second plurality of bond wires) configured to attach to the ground plate 732 and overlay the optical emissions component 740 parallel to the length 776 of the optical emissions component 740. Thus, the second set of grounded bond wires 730*b* cross perpendicular to the first set of grounded bond wires 730*a*, closing potential gaps in the wire bond EMI cage 700 structure through which electromagnetic radiation may escape or enter.

As further depicted in FIG. 7, the first set of grounded bond wires 730*a* of the wire bond EMI cage 700 are attached parallel to the neighboring grounded bond wires 730*a* and spaced according to an EMI cage gap 774. To prevent the transmission of electromagnetic radiation through the wire bond EMI cage 700, the EMI cage gap 774 is configured based on the frequency and/or wavelength of the electromagnetic radiation to be blocked. For example, at a minimum, the EMI cage gap 774 is smaller than the wavelength of the electromagnetic radiation to be blocked. Thus, for electromagnetic radiation with a frequency of 10 gigahertz, having a wavelength of 30 millimeter, the EMI cage gap 774 may be smaller than 30 millimeter to prevent the passage of 10 gigahertz, or lower, electromagnetic radiation through the wire bond EMI cage 700.

However, for effective shielding, in some embodiments the EMI cage gap 774 may be $\frac{1}{50}$ of the wavelength of the highest frequency of the electromagnetic radiation to be blocked, where the ratio of $\frac{1}{50}$ is a general rule of thumb which may vary based on the shielding design objectives. Returning to our example targeting 10 gigahertz electromagnetic radiation, $\frac{1}{50}$ of the wavelength of a 10 gigahertz wave is approximately 0.6 millimeters. Thus, in some embodiments, to effectively shield electromagnetic radiation of 10 gigahertz, the EMI cage gap 774 may be 0.6 millimeters or smaller.

As further depicted in FIG. 7, the EMI cage opening 750 is defined by an EMI cage opening gap height 770 and an EMI cage opening gap width 772. The EMI cage opening gap height 770 and EMI cage opening gap width 772 are both larger than the EMI cage gap 774 defined between the first set of grounded bond wires 730*a*. The larger EMI cage opening gap height 770 and EMI cage opening gap width 772 allow the optical field of illumination of the optical output (e.g., optical output 660) to pass through the wire bond EMI cage 700 uninhibited. In some embodiments, the distance of the EMI cage opening gap height 770 and the EMI cage opening gap width 772 may be equivalent.

Figure 8B:
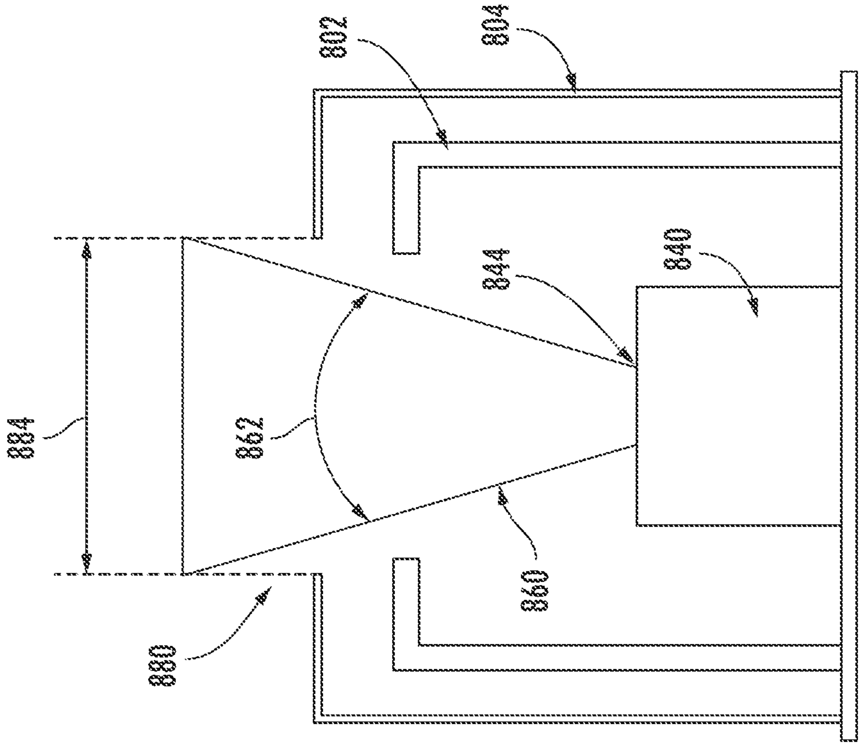
FIG. 8A-FIG. 8B illustrates a side view of an example optical emissions component protected by a wire bond EMI cage an example wire bond EMI cage defining an EMI cage opening allowing the transmission of optical output in accordance with an example embodiment of the present disclosure, compared to an example metal can EMI shield.
Figure 8A:
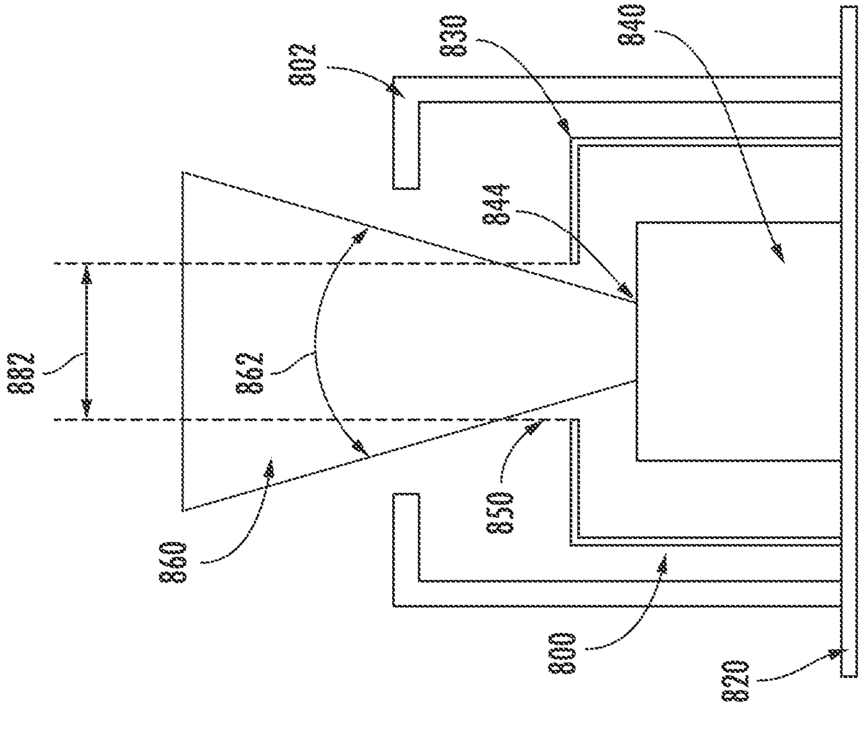

Referring now to FIG. 8A and FIG. 8B, a wire bond EMI cage 800 positioned within the device housing 802 is shown in comparison to a metal can EMI shield 804, for example, as described in relation to FIG. 1.

As depicted in FIG. 8A, the wire bond EMI cage 800 comprises a plurality of bond grounded bond wires 830 attached to a substrate 820 and overlaying an optical emissions component 840. The wire bond EMI cage 800 comprises an EMI cage opening 850 aligned with the optical emission region 844 of the optical emissions component 840 allowing the passage of the full optical field of illumination 862 to pass through the wire bond EMI cage 800 uninhibited. As depicted in FIG. 8A, the wire bond EMI cage 800 is positioned within the device housing 802 of the optical emission device, enabling a smaller EMI cage opening gap 882 in the wire bond EMI cage 800.

As depicted in FIG. 8B, the metal can EMI shield 804 is positioned outside of the device housing 802 of the optical emission device. Thus, in order to allow passage of the full optical field of illumination 862 to pass through the metal can EMI shield 804 uninhibited, the metal can opening gap 884 of the metal can opening 880 may be larger than if placed within the device housing 802.

As depicted in FIG. 8A and FIG. 8B, the optical output 860 of the optical emissions component 840 emanates from the optical emission region 844 of the optical emissions component 840 at an angle, creating an optical field of illumination 862 that becomes wider as the distance from the optical emission region 844 increases. A metal can EMI shield 804 positioned outside of the device housing 802 (as shown in FIG. 8B) is farther from the optical emission region 844 compared to a wire bond EMI cage 800 positioned within the device housing 802 (as shown in FIG. 8A). Thus, to allow the full optical field of illumination 862 to pass through uninhibited, the metal can opening gap 884 of the metal can EMI shield 804 may be larger than the EMI cage opening gap 882 of the wire bond EMI cage 800, given the same optical output 860.

Figure 9:
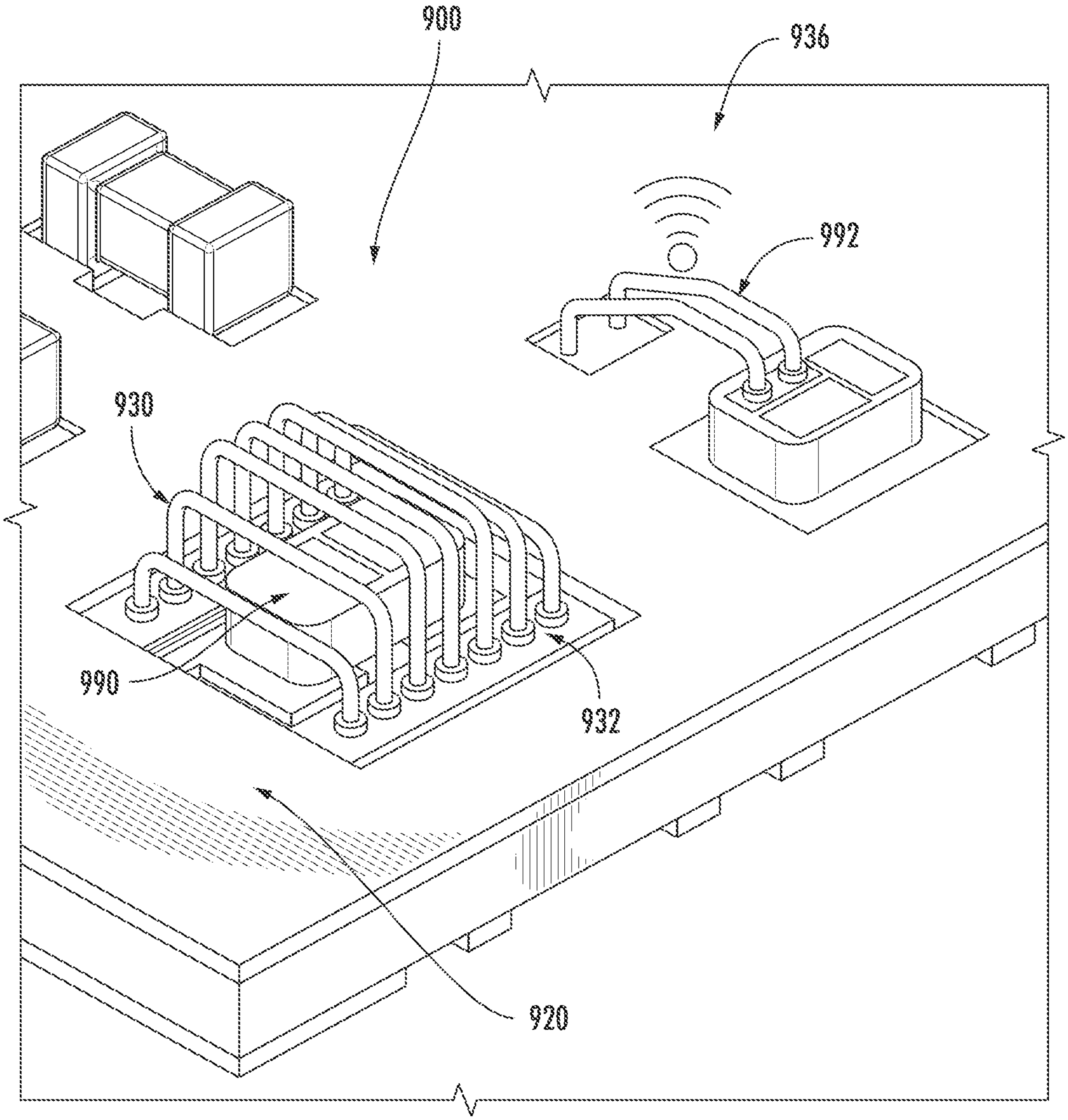
FIG. 9 illustrates a perspective view of an example electrical component protected by an example wire bond EMI cage in accordance with an example embodiment of the present disclosure.

Referring now to FIG. 9, an example wire bond EMI cage 900 is depicted overlaying an example SMT electrical component 990 (e.g., target electrical portion). As depicted in FIG. 9, the example wire bond EMI cage 900 includes a plurality of grounded bond wires 930 in a non-linear configuration, attached to a ground plate 932 and extending above the surface of the SMT electrical component 990. As further depicted in FIG. 9, a nearby electromagnetic emitting electrical component 992 is emitting external electromagnetic emissions 936. The SMT electrical component 990 and electromagnetic emitting electrical component 992 are further shown attached to a substrate 920.

As depicted in FIG. 9, the design flexibility of a wire bond EMI cage 900 comprising grounded bond wires 930 enables wire bond EMI cages 900 to be placed around electrical components of various shapes, sizes and types. As depicted in FIG. 9, the wire bond EMI cage 900 may be designed in a non-linear pattern with grounded bond wires 930 of various heights, enabling the wire bond EMI cage 900 to closely match the contours of the underlying electrical component (e.g., SMT electrical component 990). Closely matching the contours of the underlying electrical component may reduce the space occupied by a wire bond EMI cage 900 and provide better protection against penetration from external electromagnetic emissions 936. Although depicted in FIG. 9 as overlaying an SMT electrical component 990, non-linear wire bond EMI cages 900 matching the contours of the underlying electrical component may be utilized on any electrical component identified as emitting disruptive electromagnetic radiation and/or susceptible to disruption from external electromagnetic radiation (e.g., external electromagnetic emissions 936).

Figure 10:
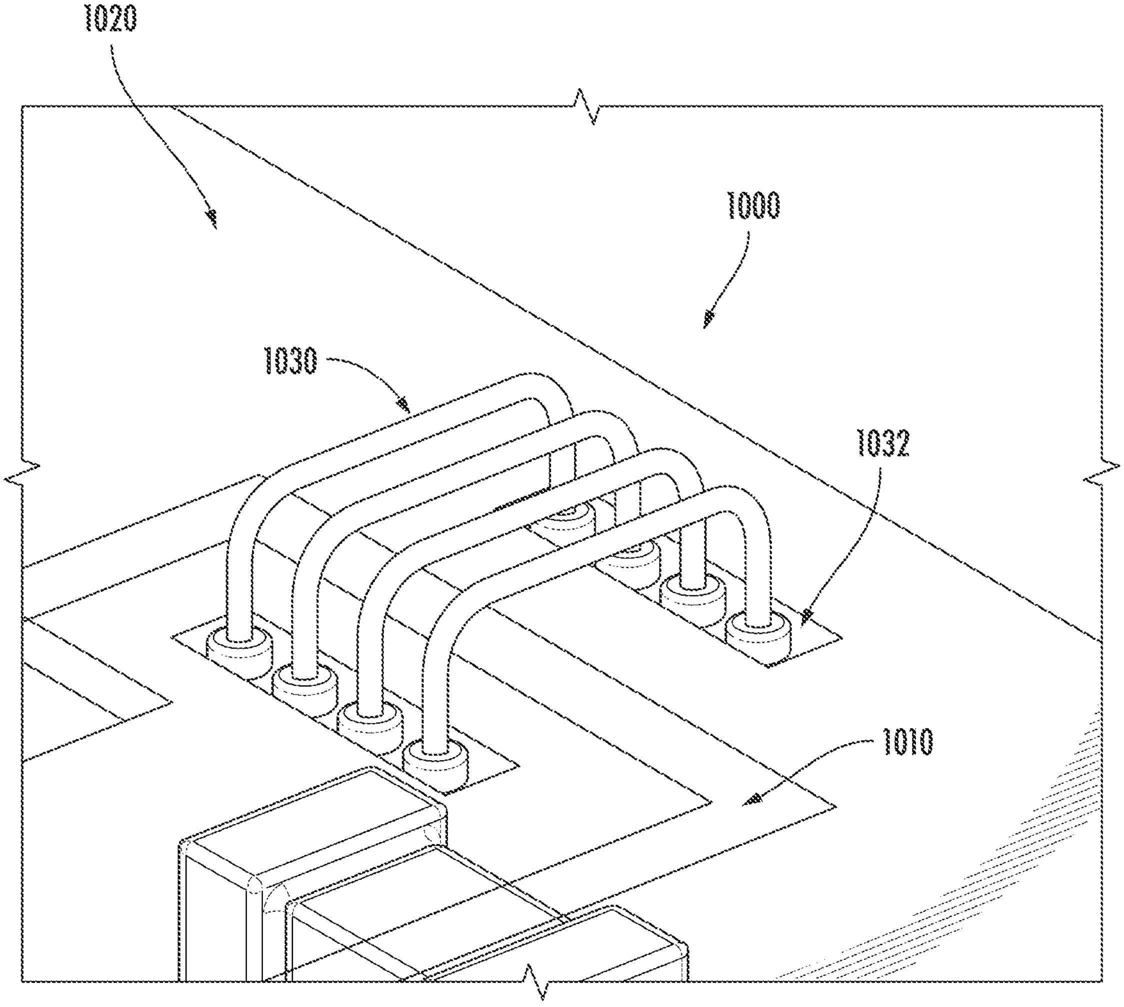
FIG. 10 illustrates a perspective view of an example wire bond EMI cage overlaying a substrate trace in accordance with an example embodiment of the present disclosure.

Referring now to FIG. 10, an example wire bond EMI cage 1000 comprising a plurality of grounded bond wires 1030 attached to a ground plate 1032 in a substrate 1020 of an electronic device is provided. As depicted in FIG. 10, the grounded bond wires 1030 extend over a substrate trace 1010 (e.g., target electrical portion) preventing electromagnetic radiation from entering into or exiting the wire bond EMI cage 1000.

As depicted in FIG. 10, the wire bond EMI cage 1000 comprising grounded bond wires 1030 may be utilized to protect electrical components within the substrate 1020 of an electronic device, such as a substrate trace 1010. Electrical components within the substrate 1020 of an electronic device may be identified as emitting disruptive electromagnetic radiation and/or being susceptible to disruption from external electromagnetic radiation through simulations, testing, or other means. Wire bond EMI cages 1000 may be positioned to overlay such electrical components. Identifying the electrical components that are sources of electromagnetic radiation or susceptible to disruption from electromagnetic radiation, and placing a wire bond EMI cages 1000 in direct proximity to the electrical components, may reduce the space occupied by an EMI shield configured to protect the entire electrical device.

Figure 11A:
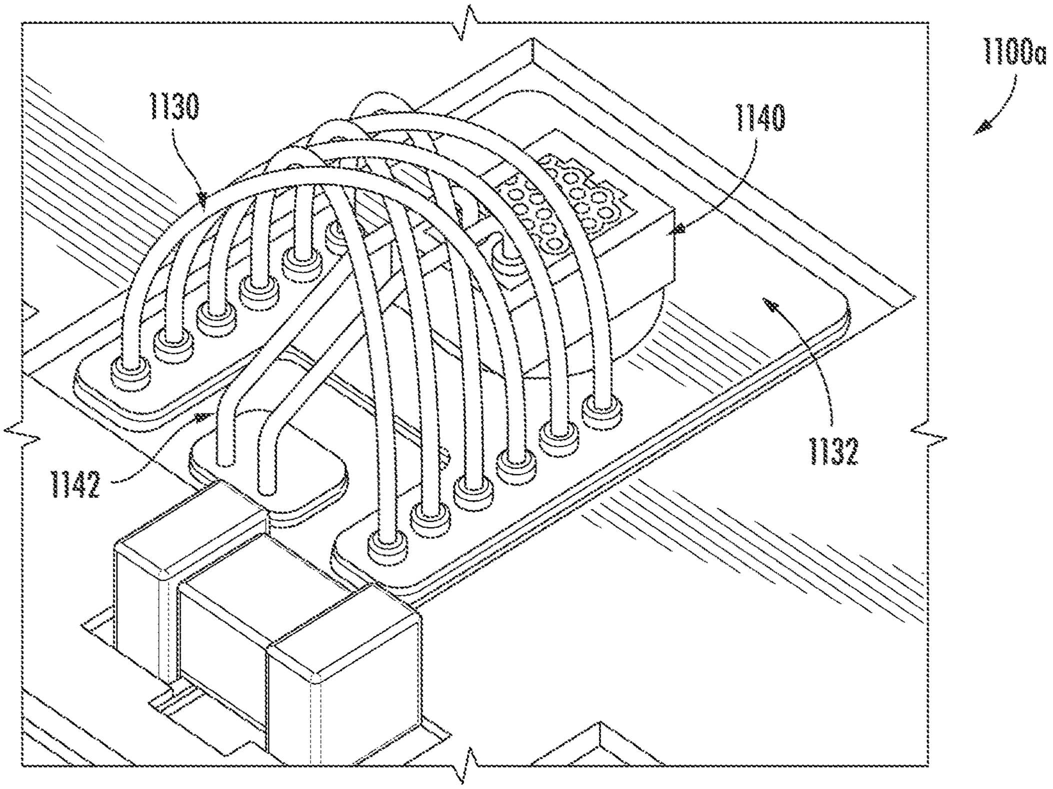
FIG. 11A-FIG. 11B illustrates further example embodiments of wire bond EMI cages in accordance with an example embodiment of the present disclosure.

Referring now to FIG. 11A, an example wire bond EMI cage 1100*a* comprising non-parallel grounded bond wires 1130 is provided. As depicted in FIG. 11A, the plurality of grounded bond wires 1130 attach to the ground plate 1132 and extend over the target electrical portion 1142 of the optical emissions component 1140, crossing over a portion of the plurality of grounded bond wires 1130.

As depicted in FIG. 11A, wire bond EMI cages comprising bond wires enable various patterns of wire bond EMI cages to be defined. For example, crossing one or more of the grounded bond wires 1130 may close gaps in the wire bond EMI cage 1100*a* exposed by parallel bond wires. In addition, crossing bond wires may enable the wire bond EMI cage 1100*a* to closely match the contours of the optical emissions component 1140, reducing the space occupied by the wire bond EMI cage 1100*a*. Although depicted as primarily overlaying the target electrical portion 1142 in FIG. 11A, the wire bond EMI cage 1100*a* may be extended to create an EMI cage opening (e.g., EMI cage opening 550, 650, 750, 850) around the optical emission region of the optical emissions component 1140.

Figure 11B:
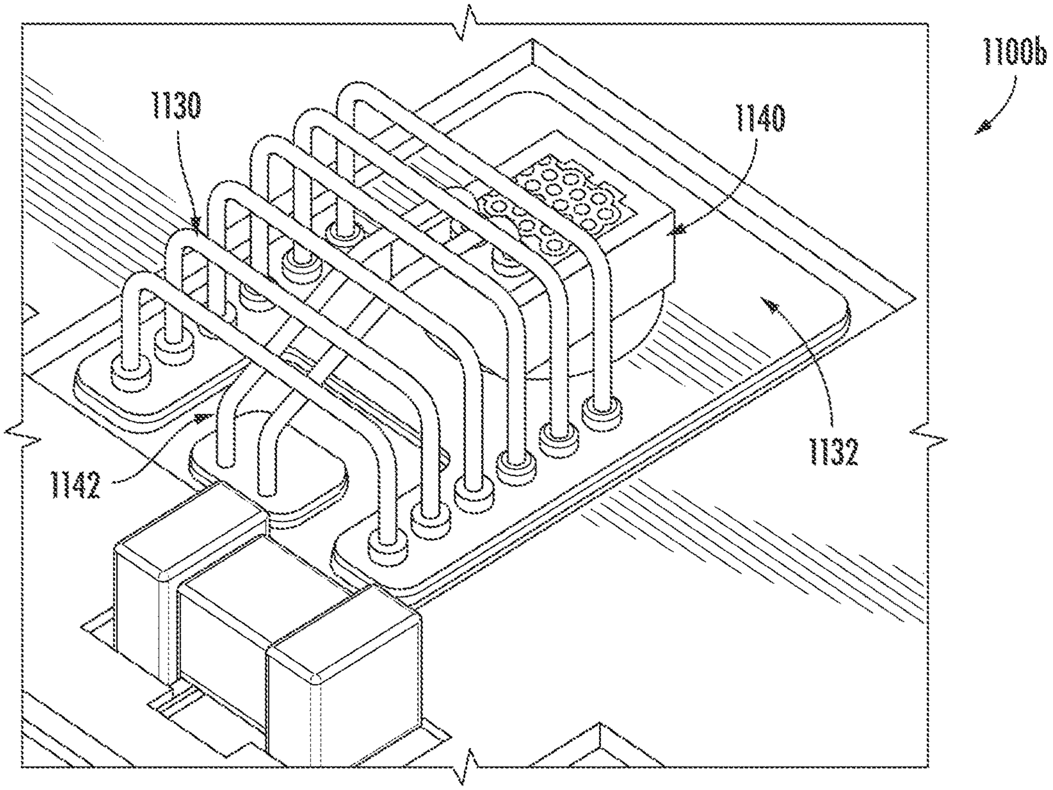

Referring now to FIG. 11B, an example wire bond EMI cage 1100*b* comprising grounded bond wires 1130 with varying heights is provided. As depicted in FIG. 11B, the plurality of grounded bond wires 1130 attach to the ground plate 1132 and extend over the target electrical portion 1142 of the optical emissions component 1140. The height of each grounded bond wire 1130 is configured to match the contours of the optical emissions component 1140.

As depicted in FIG. 11B, wire bond EMI cages comprising bond wires enable various wire bond EMI cages having varying heights to be created. For example, adjusting the height of the individual grounded bond wires 1130 to match the contours of the underlying optical emissions component may close gaps in the wire bond EMI cage 1100*b* exposed by bond wires with a uniform height. In addition, varying the height of bond wires comprising the wire bond EMI cage 1100*a* to closely match the contours of the optical emissions component 1140, may reduce the space occupied by the wire bond EMI cage 1100*b*. Although depicted as primarily overlaying the target electrical portion 1142 in FIG. 11B, the wire bond EMI cage 1100*b* may be extended to create an EMI cage opening (e.g., EMI cage opening 550, 650, 750, 850) around the optical emission region of the optical emissions component 1140.

While this detailed description has set forth some embodiments of the present invention, the appended claims cover other embodiments of the present invention which differ from the described embodiments according to various modifications and improvements. For example, one skilled in the art may recognize that such principles may be applied to any electronic component that emits electromagnetic radiation and/or is susceptible to disruption from external electromagnetic radiation.

Within the appended claims, unless the specific term "means for" or "step for" is used within a given claim, it is not intended that the claim be interpreted under 35 U.S.C. 112, paragraph 6.

Use of broader terms such as "comprises," "includes," and "having" should be understood to provide support for narrower terms such as "consisting of," "consisting essentially of," and "comprised substantially of" Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

The invention claimed is:

1. An apparatus comprising:

an optical emissions component configured to generate an optical output at an optical emission region, wherein the optical emissions component is electrically connected to a target electrical portion; and a wire bond electromagnetic interference cage configured to block passage of electromagnetic emissions, comprising:

a plurality of bond wires, wherein each bond wire of the plurality of bond wires is electrically coupled to an electrical ground, and wherein the plurality of bond wires are spaced according to a first gap between adjacent ones of the plurality of bond wires;

wherein the wire bond electromagnetic interference cage overlays at least a portion of the target electrical portion, wherein the wire bond electromagnetic interference cage defines an electromagnetic interference cage opening through which the optical output passes, and wherein the electromagnetic interference cage opening is defined at least by an electromagnetic interference cage opening gap height greater than the first gap between adjacent ones of the plurality of bond wires.

2. The apparatus of claim 1, wherein the optical emissions component further comprises a first side and a second side opposite the first side, wherein each bond wire of the plurality of bond wires is electrically connected to the electrical ground at a first bond wire end on the first side of the optical emissions component, wherein each bond wire of the plurality of bond wires is electrically connected to the electrical ground at a second bond wire end on the second side of the optical emissions component such that each bond wire passes over a portion of the optical emissions component, and wherein each bond wire extends to a maximum wire bond electromagnetic interference cage height.

3. The apparatus of claim 2, further comprising:

a second plurality of bond wires, wherein the optical emissions component includes a first end and a second end, wherein each bond wire of the second plurality of bond wires is electrically connected to the electrical ground on the first end of the optical emissions component, and wherein each bond wire of the second plurality of bond wires is electrically connected to the electrical ground on the second end of the optical emissions component such that each bond wire of the second plurality of bond wires passes over the portion of the optical emissions component perpendicular to the plurality of bond wires.

4. The apparatus of claim 2, wherein the plurality of bond wires are parallel.

5. The apparatus of claim 2, wherein the maximum wire bond electromagnetic interference cage height is a distance from the top of the optical emissions component to a bond wire of the plurality of bond wires.

6. The apparatus of claim 5, wherein the maximum wire bond electromagnetic interference cage height is between 0.050 millimeters and 0.160 millimeters.

7. The apparatus of claim 2, wherein the plurality of bond wires comprise at least a first bond wire and a second bond wire, and wherein the first bond wire and the second bond wire cross.

8. The apparatus of claim 2, wherein the first bond wire end of each bond wire of the plurality of bond wires is attached to the electrical ground with a ball bond and the second bond wire end of each bond wire of the plurality of bond wires is attached to the electrical ground with a ball bond or a wedge bond.

9. The apparatus of claim 1, wherein the first gap is less than or equal to 0.6 millimeters.

10. The apparatus of claim 1, wherein the optical emissions component comprises a vertical-cavity surface-emitting laser.

11. The apparatus of claim 1, wherein the target electrical portion is susceptible to electromagnetic interference.

12. The apparatus of claim 11, wherein the wire bond electromagnetic interference cage blocks transmission of electromagnetic interference to the target electrical portion from an external electromagnetic interference source.

13. The apparatus of claim 1, wherein the target electrical portion generates electromagnetic interference.

14. The apparatus of claim 13, wherein the wire bond electromagnetic interference cage blocks transmission of electromagnetic interference from the target electrical portion.

15. The apparatus of claim 1, wherein the wire bond electromagnetic interference cage is configured to block electromagnetic emissions up to 135 gigahertz.

16. An optical emission device comprising:

a device housing;

one or more electrical components disposed on a substrate within the device housing, the one or more electrical components comprising at least:

an optical emissions component configured to generate an optical output at an optical emission region, wherein the optical emissions component is electrically connected to a target electrical portion; and a wire bond electromagnetic interference cage disposed within the device housing and configured to block passage of electromagnetic emissions, comprising:

a plurality of bond wires, wherein each bond wire of the plurality of bond wires is electrically coupled to an electrical ground, and wherein the plurality of bond wires are spaced according to a first gap between adjacent ones of the plurality of bond wires;

wherein the wire bond electromagnetic interference cage overlays at least a portion of the target electrical portion, wherein the wire bond electromagnetic interference cage defines an electromagnetic interference cage opening through which the optical output passes, and wherein the electromagnetic interference cage opening is defined at least by an electromagnetic interference cage opening gap height greater than the first gap between adjacent ones of the plurality of bond wires.

17. The optical emission device of claim 16, the device housing further comprising an optical emission opening aligned with the optical emissions component and configured to allow the optical output to pass out of the device housing.

18. The optical emission device of claim 17, wherein the optical emission opening is bigger than the electromagnetic interference cage opening.

19. The optical emission device of claim 16, wherein the optical emissions component further comprises a first side and a second side opposite the first side, wherein each bond wire of the plurality of bond wires is electrically connected to the electrical ground at a first bond wire end on the first side of the optical emissions component, wherein each bond wire of the plurality of bond wires is electrically connected to the electrical ground at a second bond wire end on the second side of the optical emissions component such that each bond wire passes over a portion of the optical emissions component, and wherein each bond wire extends to a maximum wire bond electromagnetic interference cage height.

* * * * *